United States Patent
Kurokawa et al.

(10) Patent No.: US 7,272,811 B2
(45) Date of Patent: Sep. 18, 2007

(54) AUTOMATIC LAYOUT METHOD OF SEMICONDUCTOR INTEGRATED CIRCUIT

(75) Inventors: Keiichi Kurokawa, Hyogo (JP);
Takuya Yasui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 339 days.

(21) Appl. No.: 11/030,297

(22) Filed: Jan. 7, 2005

(65) Prior Publication Data
US 2005/0155007 A1    Jul. 14, 2005

(30) Foreign Application Priority Data
Jan. 9, 2004    (JP)    ............. P. 2004-003870

(51) Int. Cl.
*G06F 17/50*    (2006.01)
(52) U.S. Cl. ............... 716/10; 716/8; 716/9; 716/12
(58) Field of Classification Search ............... 716/8–14
See application file for complete search history.

(56) References Cited

U.S. PATENT DOCUMENTS

| | | | |
|---|---|---|---|
| 6,553,338 B1 * | 4/2003 | Buch et al. | 703/14 |
| 6,591,407 B1 | 7/2003 | Kaufman et al. | |
| 6,886,147 B2 * | 4/2005 | Johnson et al. | 716/6 |
| 6,973,632 B1 * | 12/2005 | Brahme et al. | 716/6 |
| 7,137,093 B2 * | 11/2006 | Harn | 716/10 |
| 2003/0005398 A1 * | 1/2003 | Cho et al. | 716/8 |
| 2003/0088842 A1 | 5/2003 | Cirit | |
| 2004/0243964 A1 * | 12/2004 | McElvain et al. | 716/12 |
| 2005/0034091 A1 * | 2/2005 | Harn | 716/6 |
| 2006/0101361 A1 * | 5/2006 | Foreman et al. | 716/6 |

OTHER PUBLICATIONS

L. N. Kannan, et al. "A Methodology and Algorithms for Post-Placement Delay Optimization," Proc. 31st Design Automation Conference, 1994.
M. Murofushi, et al. "Layout Driven Re-synthesis for Low Power Consumption LSIs," In Proc. 34th Design Automation Conference, 1997.

* cited by examiner

*Primary Examiner*—Stacy A Whitmore
*Assistant Examiner*—Magid Y. Dimyan
(74) *Attorney, Agent, or Firm*—McDermott Will & Emery LLP (57) ABSTRACT

An automatic layout method of a semiconductor integrated circuit includes an initial arranging step for initially arranging a logic cell which constitutes the logic circuit; a placement base circuit optimizing step for applying a margin of a constant length to a wiring line length obtained from a placement so as to improve timing; an placement change restriction calculating step for calculating a placement change restriction corresponding to the margin of the constant length; and an incremental arranging step in which when a logic cell placement of a corrected logic circuit is improved, a placement improvement having the placement change restriction calculated based upon the placement change restriction calculating step is carried out.

12 Claims, 12 Drawing Sheets

AUTOMATIC LAYOUT METHOD OF SEMICONDUCTOR INTEGRATED CIRCUIT

BACKGROUND OF THE INVENTION

1. Field of the Invention

The present invention is related to a logic cell placement improving method for timing closure in a smooth manner in a layout design of a semiconductor integrated circuit.

2. Description of the related art

In connection with progress of very fine techniques, such a timing closure problem occurs in which timing designs are not completed after layouts have been designed. As methods of capable of solving this timing closure problem, optimizing methods for optimizing circuits at layout designing stages have been proposed (for instance, (L. N. Kannan, P. R. Suaris, and H. Fang, "A methodology and algorithms for post-placement delay optimization," Proc. 31st Design Automation Conference, 1994), (M. Murofushi, T. Ishioka, M. Murakata, T. Mitsuhashi, "Layout Driven Re-synthesis for Low Power Consumption LSIs," in Proc.34th Design Automation Conference, 1997)).

A problem owned by these solving methods occurs as follows: That is, although a circuit improvement operation is carried out based upon layout information, since correct timing information of such a circuit obtained after the circuit improvement has been made cannot be grasped unless the improved circuit is again layout-processed (layout retry process), there is such a risk that a timing violation may newly occur at a time when the improved circuit is again layout-processed. Therefore, the circuit improving operation and the layout process operation must be repeatedly carried out, resulting in the problem. Also, other methods capable of avoiding (otherwise, reducing) such repetition operations have been proposed (for instance, Japanese Laid-open patent Application No. Hei-10-284612). In the patent publication 1, while no timing violation occurs at the time when the circuit is corrected, the above-described repetition operation is avoided by previously and excessively improving the portion whose timing margin is small.

However, in the conventional technique, there is no relationship between the excessively improved amount when the circuit is improved and the layout retry method. As a result, if the circuit is excessively improved, then the improved circuit may merely endure the variations occurred when the layout process operation is retried. Thus, the conventional technique cannot completely eliminate the above-explained repetition operation, but also cannot guarantee that the repetition operation is converged. This reason is given as follows: That is, when a large number of circuits are improved with having a margin, a circuit change amount is increased, so that a layout of the improved circuit is largely changed when the layout process operation is retried. As a consequence, there is a close relationship between the layout retry method and the amount of the circuit which is excessively improved.

SUMMARY OF THE INVENTION

An object of the present invention is to provide an automatic layout method capable of completely eliminating a repetition operation as to both a circuit improvement and a layout retry operation, or capable of guaranteeing that the repetition operation is converged.

To solve this problem, an automatic layout method, according to the present invention, is featured by comprising: an initial arranging step for initially arranging a logic cell which constitutes the logic circuit; a placement base circuit optimizing step for applying a margin of a constant length to a wiring line length obtained from a placement so as to improve timing; a placement change restriction calculating step for calculating a placement change restriction corresponding to the margin of the constant length; and an incremental arranging step in which when a logic cell placement of a optimized logic circuit is improved, a placement improvement having the placement change restriction calculated based upon the placement change restriction calculating step is carried out.

In accordance with the present invention, since the layout retry method is restricted, an upper limit value as to variations in wiring lines when the layout retry operation is carried out is defined, and then, a timing improvement is carried out by considering this defined variation. As a consequence, a timing violation does not occur after the layout retry operation has been carried out. Therefore, since the timing improving operation and the layout retry operation are not repeatedly carried out, the design term can be shortened.

DESCRIPTION OF THE PREFERRED EMBODIMENTS

Next, as to an embodiment mode of the present invention, a cell base designing method realized by mapping circuits to a previously prepared standard cell will now be described as an exemplification with reference to drawings.

It should be understood that the present invention is not limited only to this embodiment mode, but may be carried out in various embodiment modes without departing from the technical scope thereof.

First Embodiment Mode

Figure 1:
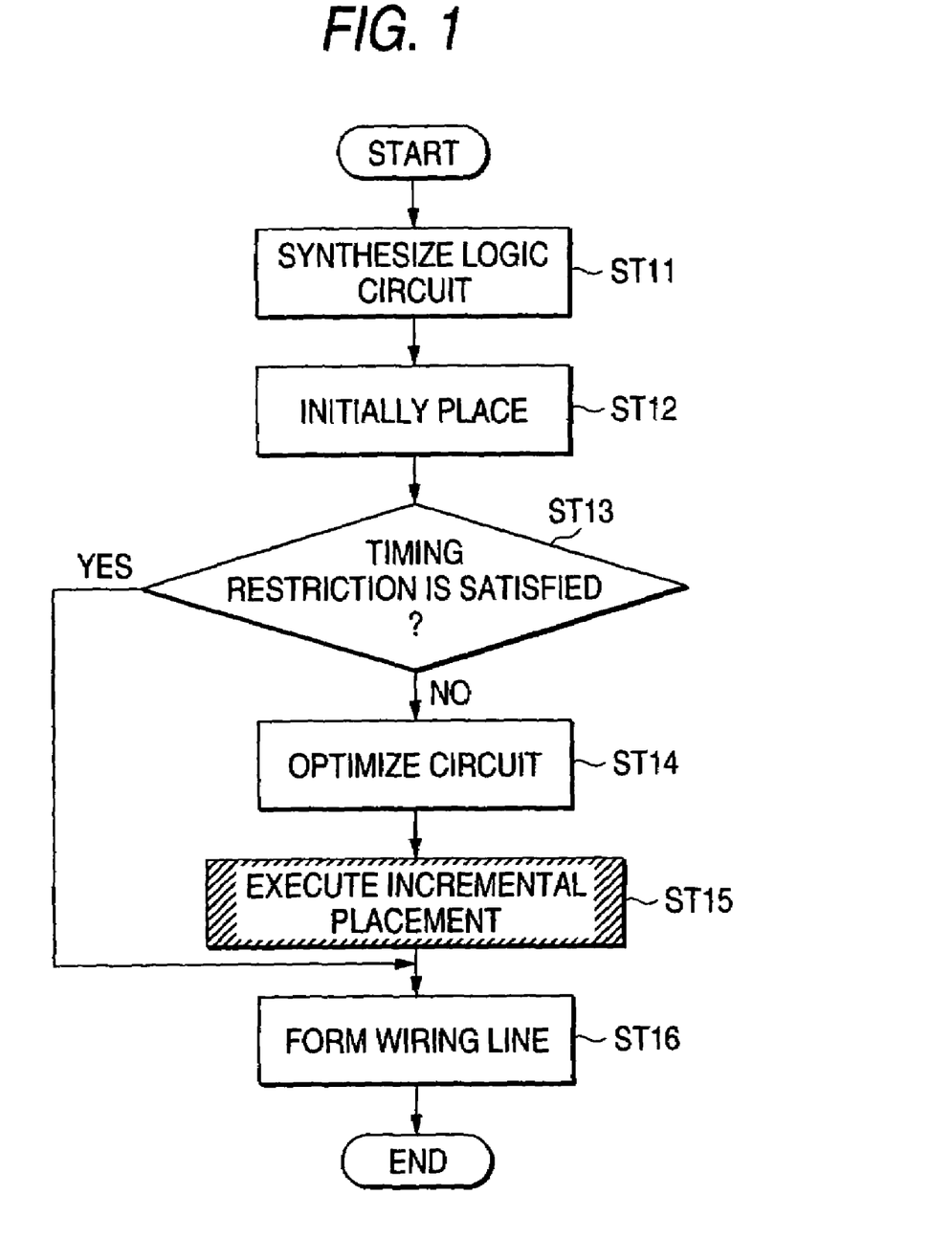
FIG. 1 is a diagram for indicating a process flow chart according to a first embodiment mode of the present invention.

A description is made of a layout method according to a first embodiment mode of the present invention with reference to a flow chart shown in FIG. 1.

First, in a step ST11 of the flow chart, an RT level circuit is converted into a logic circuit which may satisfy a designated timing restriction by employing a logic synthesizing function. The synthesized logic circuit is constituted by such logic cells which are realized by mapping (instantiation) standard cells.

Next, in a step ST12, the above-described logic cells are initially placed.

Next, in a step ST13, a judgement is made as to whether or not the initially-placed logic cells can satisfy the timing restriction by employing such wiring line information which is obtained from arranging information, and also, delay information of the standard cell. When the initially-placed logic cells can satisfy the timing restriction, the processing operation of this layout method is advanced to a step ST16, whereas when the initially-placed logic cells cannot satisfy the timing restriction, the process operation is advanced to another step ST14.

In this step ST14, while a margin of 4L is set to wiring line information which is obtained from the initial placement result, a timing optimization is carried out. As the timing optimizing method, this timing optimizing method may be readily carried out by employ the below-mentioned manner: (L. N. Kannan, P. R. Suaris, and H. Fang, "A methodology and algorithms for post-placement delay optimization," Proc. 31st Design Automation Conference, 1994), (M. Murofushi, T. Ishioka, M. Murakata, T. Mitsuhashi, "Layout Driven Re-synthesis for Low Power Consumption LSIs," in Proc. 34th Design Automation Conference, 1997)

Figure 2:
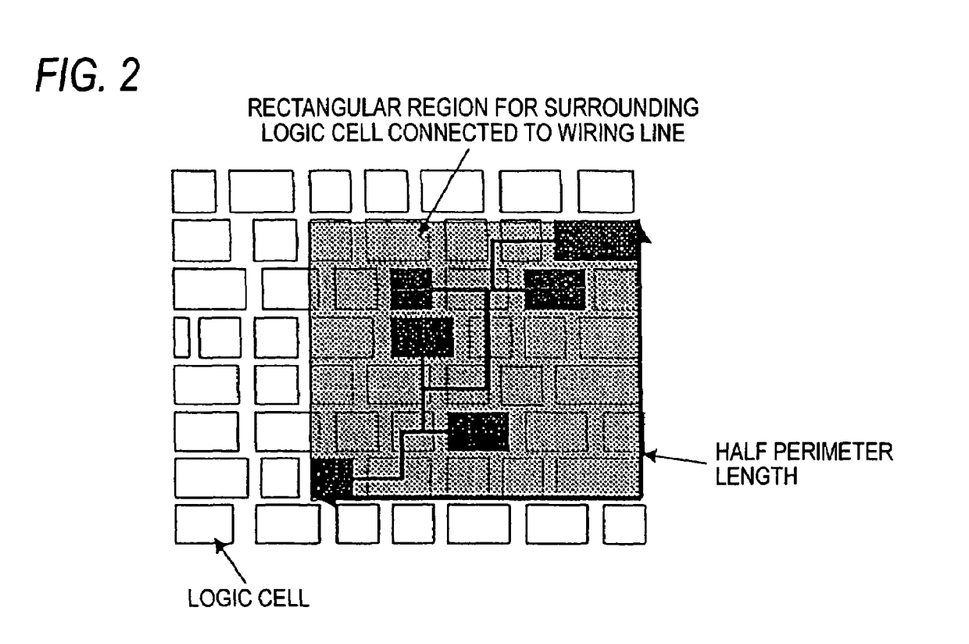
FIG. 2 is a diagram for representing a half perimeter length of a rectangular region for surrounding a wiring line.

For the sake of simple explanations, in this case, a predicted wiring line length is handled as such a value equivalent to a half perimeter length having a rectangular shape which surrounds a wiring line. Alternatively, this predicted wiring line length may be calculated by employing a formula based upon the half perimeter length, while this predicted wiring line length is not handled as the equivalent length to the half perimeter length. In this alternative case, the predicted wiring line length may be calculated by adding the margin value 4L to such a half perimeter length which is obtained from layout information. FIG. 2 is a diagram for indicating an example of a half perimeter length having a rectangular shape which surrounds a wiring line.

Figure 3:
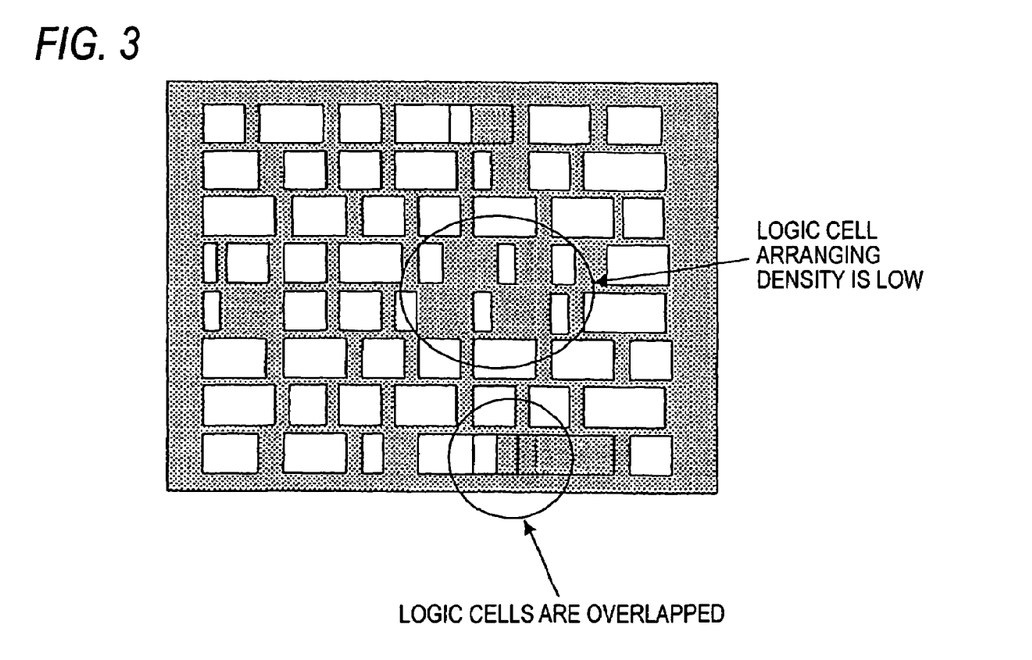
FIG. 3 is a diagram for showing coarse and fine conditions of a logic cell placement.

Under such a condition that the optimizing operation of the step ST14 is accomplished, since the logic circuit is corrected, the logic cells are overlapped with each other and/or intervals of the logic cells are largely opened, namely brought into such a condition that the initial placement of the logic cells executed in the step ST12 is disturbed. FIG. 3 is a circuit for representing an example of a logic cell placement obtained at such a time instant when the optimizing operation of the step ST14 is ended. In FIG. 3, since the logic circuit is corrected, the standard cell which has been mapped to the logic cell is changed, so that the logic cells are overlapped with each other, such a region that intervals between logic cells are made longer than necessary intervals is located, resulting in a disturbance of the logic cell placement.

Figure 4:
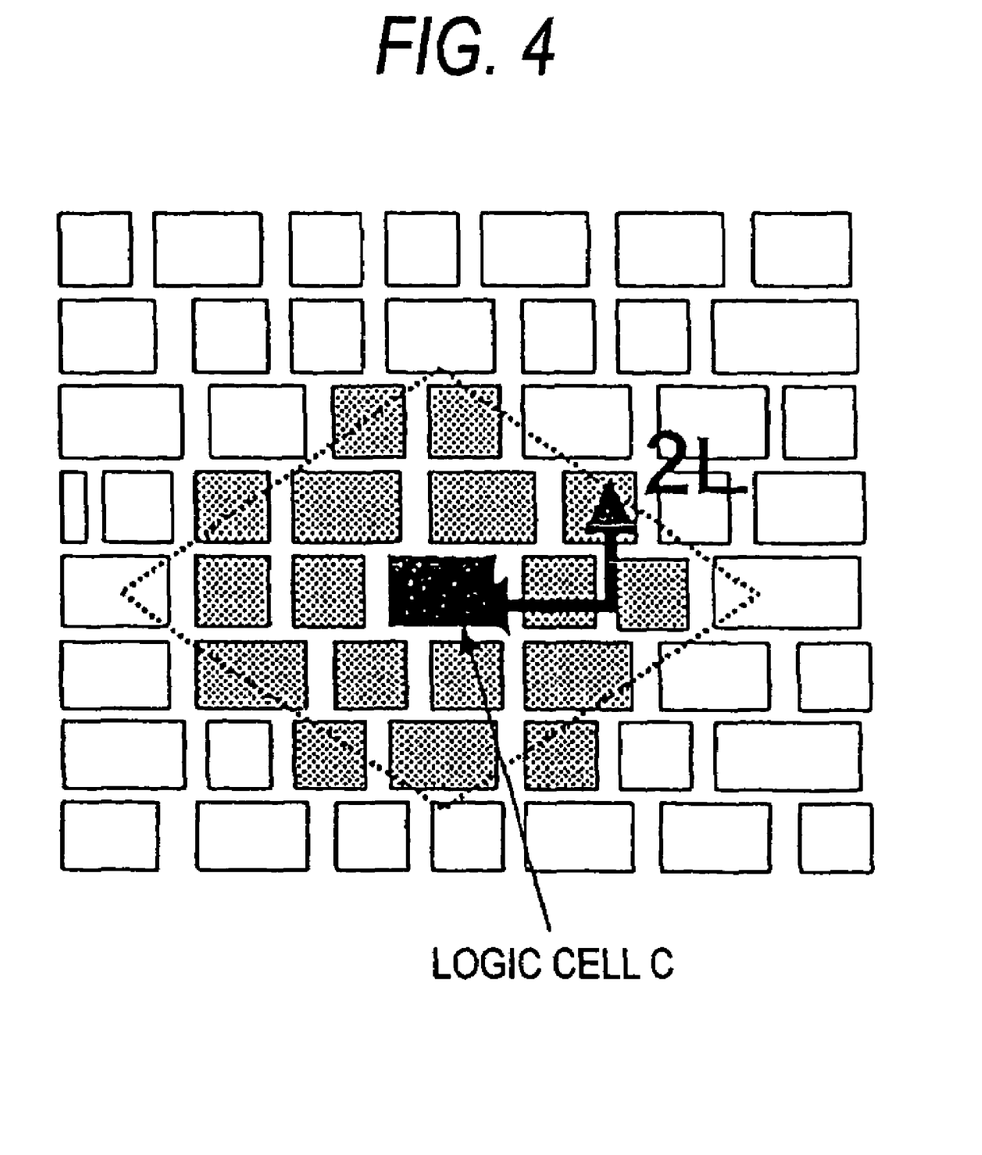
FIG. 4 is a diagram for representing a logic cell movable range.

In a step ST15, the disturbed logic cell placement is improved. As the placement improving method, such a method for moving the logic cells one by one is employed. While such a range that a Manhattan distance is equal to "2L" is set as a movable range, a logic cell is moved from the initial arranging position of the step ST12. In this case, the placement improvement is carried out in such a way that the placement evaluating formula employed in the step ST12 is calculated before and after the movement, and such an optimizing manner as simulated annealing is employed. FIG. 4 is a diagram for showing a movable range of a logic cell "C." From this diagram, such a fact can be revealed. That is, a diamond-shaped region in which a Manhattan distance is equal to 2L constitutes the movable range.

Figure 5:
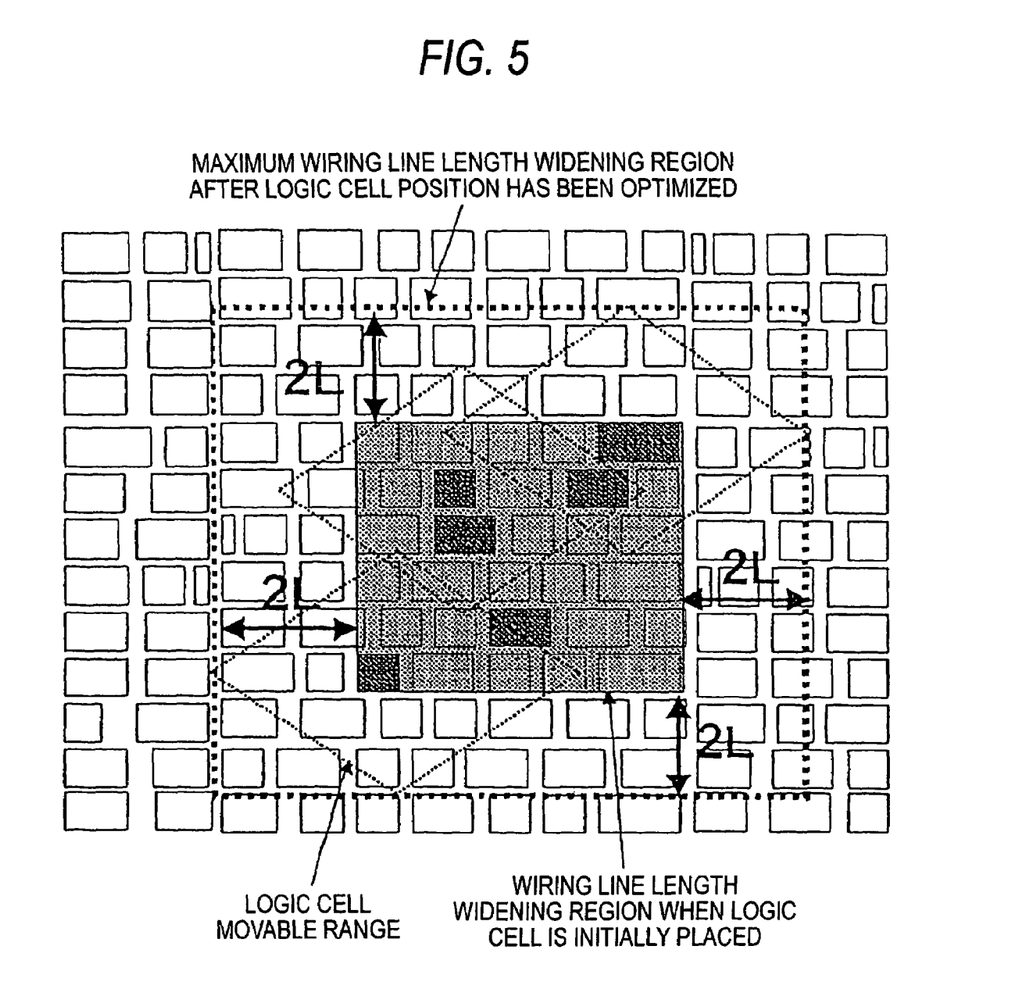
FIG. 5 is a diagram for indicting a variation of wiring line lengths in the case that a logic cell is moved.

As represented in FIG. 5, in the case that a movable range of each of logic cells is set to "2L", an increase of a half perimeter length of a rectangular region which surrounds a wiring line is maintained within "4L."

It should also be noted that a logic cell is newly added in the step ST14, this newly added logic cell is provisionally placed in this step ST14. Then, while the provisional arranging position is employed as an initial arranging position, the process operation of the step ST15 is carried out.

Finally, in a step ST16, wiring lines among the logic cells are formed.

As previously explained, since the movable ranges of the respective logic cells are limited to "2L", the increased/decreased lengths of the half perimeter length may be suppressed to "4L" which corresponds to such a margin range which has been previously considered in the step ST13. As a result, while the timing optimizing operation and the layout processing operation are not repeatedly executed many times, the timing can be closed, so that the designing term for the semiconductor integrated circuit can be shortened.

Modification of the First Embodiment Mode

A modification of the first embodiment mode owns such a different technical point from the first embodiment mode. That is, positions of two logic cells are replaced with each other in the step ST15.

This replacement is carried out in such a manner that logic cells in which mutual Manhattan distances are located within a range of "1L" (this range will be referred to as "movable cell seeking range" hereinafter) at initial positions acquired in the step ST12 are recognized as a replaceable cell set, which are sequentially replaced.

Figure 6:
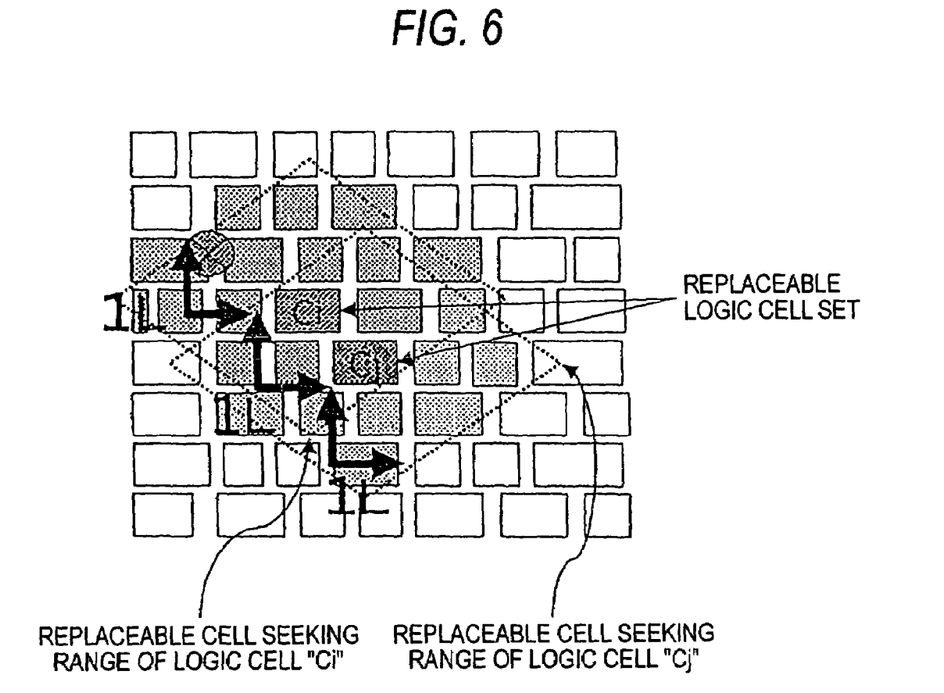
FIG. 6 is a diagram for representing a logic cell replaceable cell seeking range.

FIG. 6 is a diagram for explaining such distances. That is, when positions of replaceable logic cells are replaced with each other, such distances are illustrated over which these logic cells are moved from initial arranging positions. The respective logic cells may be positionally replaced with such logic cells which are located within a replaceable cell seeking range. In FIG. 6, logic cells "Ci" and "Cj" correspond to one of replaceable cell sets, the distances of which are the longest distances of 1L. Such a case that the logic cell Ci is replaced by a logic cell located at a boundary (namely, circle position shown in this drawing) of the replaceable cell seeking range, and thereafter, is replaced by the logic cell Cj corresponds to the case that the logic cell Cj is moved from the initial arranging position to the furthest position. In this case, a move distance becomes 2L.

Figure 7:
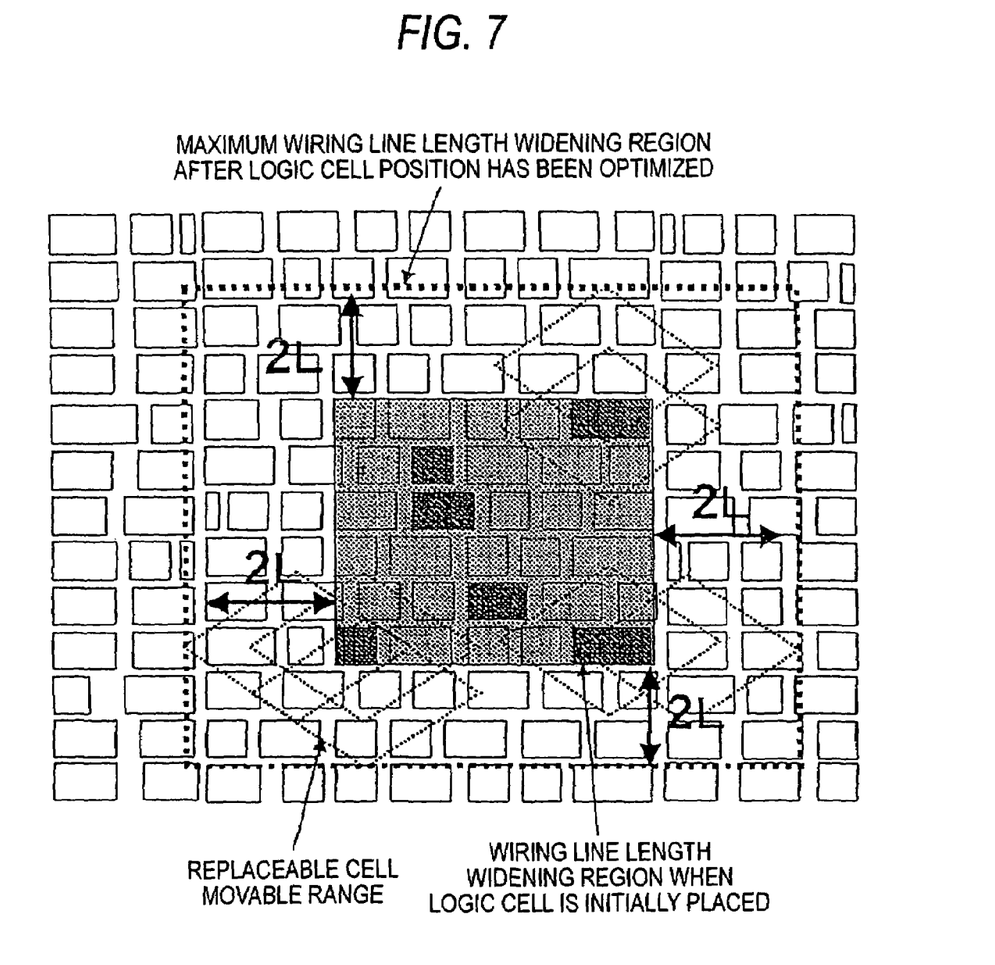
FIG. 7 is a diagram for indicating a variation of wiring line lengths in the case that a logic cell is replaced.

FIG. 7 is a diagram for explaining an increase of a half perimeter length of a region for surrounding a wiring line which is connected to a plurality of logic cells. As previously explained in FIG. 6, since there is a possibility that each of logic cells is moved over 2L at its maximum, an increase of a half perimeter length of a rectangular region which surrounds the wiring line is suppressed to 4L.

As previously described, when the positions of the logic cells are replaced with each other, the replaceable logic cells are restricted to such logic cells whose Manhattan distances are shorter than, or equal to 1L, so that the increase/decrease of the half perimeter length can be suppressed within 4L, which corresponds to the margin range which has been previously considered in the step ST13. As a result, while the timing optimizing operation and the layout processing operation are not repeatedly executed many times, the timing can be closed, so that the designing term for the semiconductor integrated circuit can be shortened.

Furthermore, in the modification of the first embodiment mode, since the positions of the two logic cells can be changed by a single operation, the speed as to the placement improvement thereof becomes faster than the speed as to the placement improvement of the first embodiment mode in which one logic cell is sequentially moved.

It should also be noted that in addition to the operation for replacing the positions of the two logic cells in the step ST15, the operation for moving the position of one logic cell may be alternatively carried out which has been explained in the first embodiment mode. In this alternative case, the movable range explained in the first embodiment mode is not selected to be 2L, but must be selected to 1L.

Figure 8:
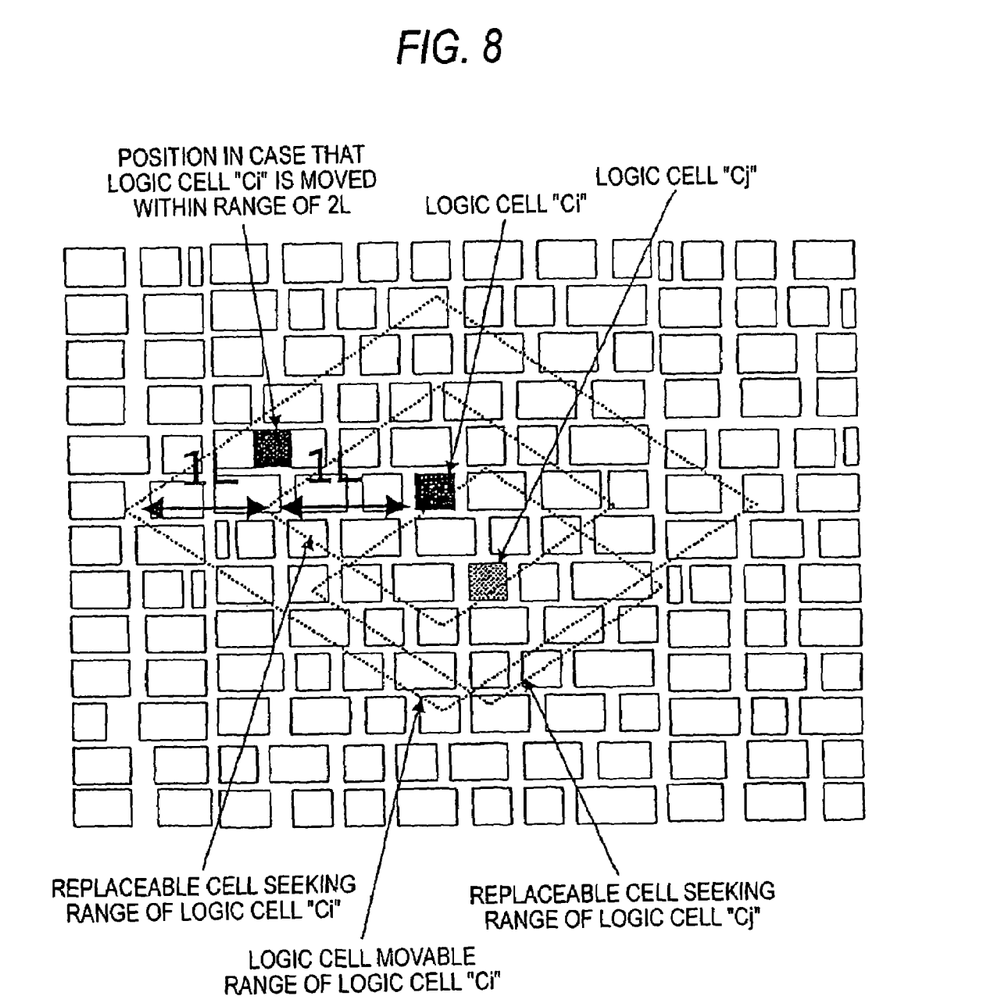
FIG. 8 is a diagram for indicating a variation of wiring line lengths in the case that a logic cell is moved, and replaced.

FIG. 8 is a diagram for explaining why the movable range must be set to 1L.

In such a case that a logic cell Ci can be moved within a range of 2L, this logic cell Ci can be moved up to such a position indicated in this drawing. If the logic cell Ci is positionally replaced by another logic cell Cj corresponding to the replaceable cell, then this logic cell Ci is moved from the initial arranging position up to such a position longer than, or equal to 2L. The movable region must be made equal to the replaceable cell seeking region, and must constitute the range of the Manhattan distance 1L.

In the case that two operations are combined with each other so as to improve a placement of logic cells, larger numbers of pattern arranging conditions can be made up, as compared with such a case that a placement of logic cells is improved by employing only one operation. As a result, more optimal placement may be realized.

Second Embodiment Mode

A layout method according to a second embodiment mode of the present invention will now be explained with employment of a flow chart shown in FIG. 9.

Figure 9:
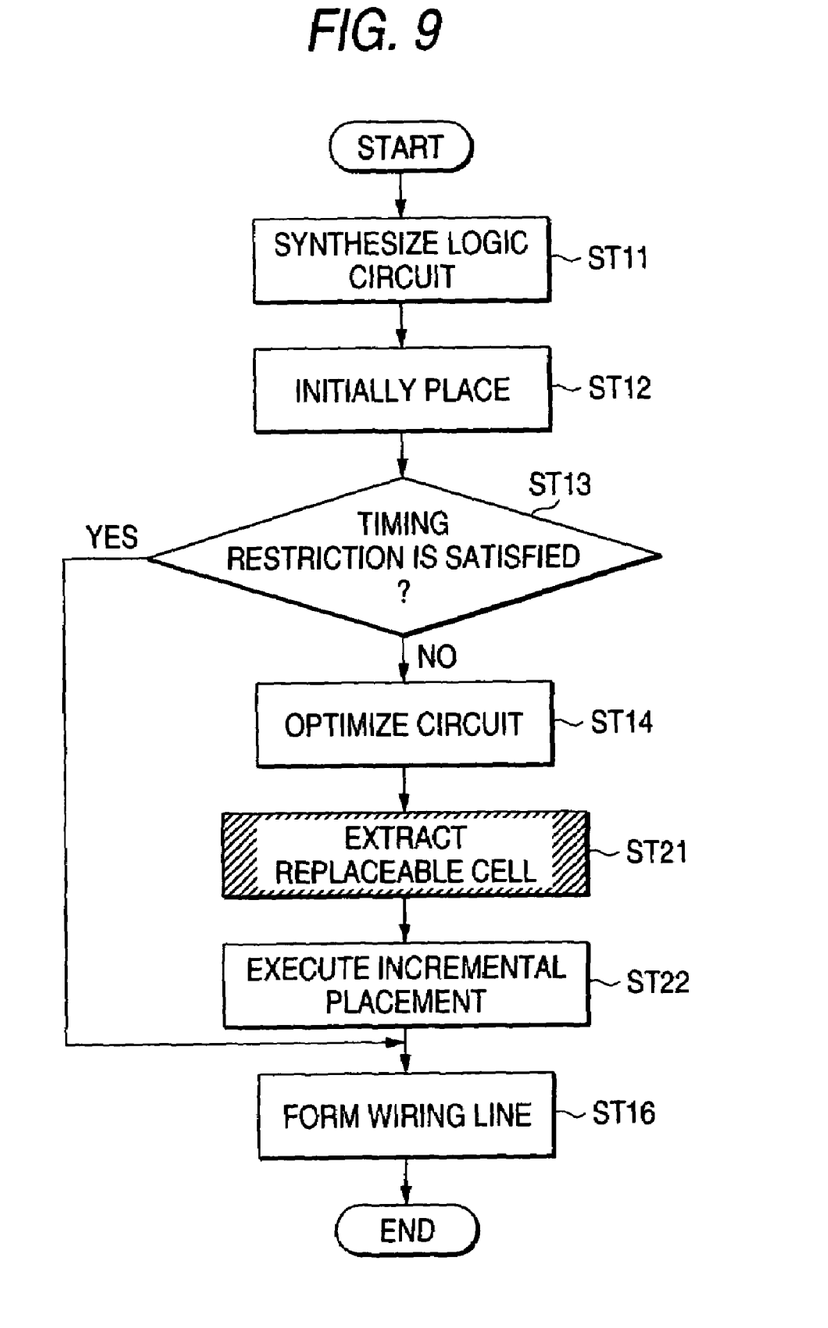
FIG. 9 is a diagram for describing a process flow chart according to a second embodiment mode of the present invention.

Steps of ST11, ST12, ST13, ST14, and ST16 in FIG. 9 correspond to same steps defined in the first embodiment mode.

The layout method is performed in same process operations to those of the first embodiment mode up to the step ST14.

In a next step ST21, replaceable logic cells are extracted (produced) from the respective logic cells. The process flow operation of this step ST21 will now be explained with reference to a flow chart shown in FIG. 10.

Figure 10:
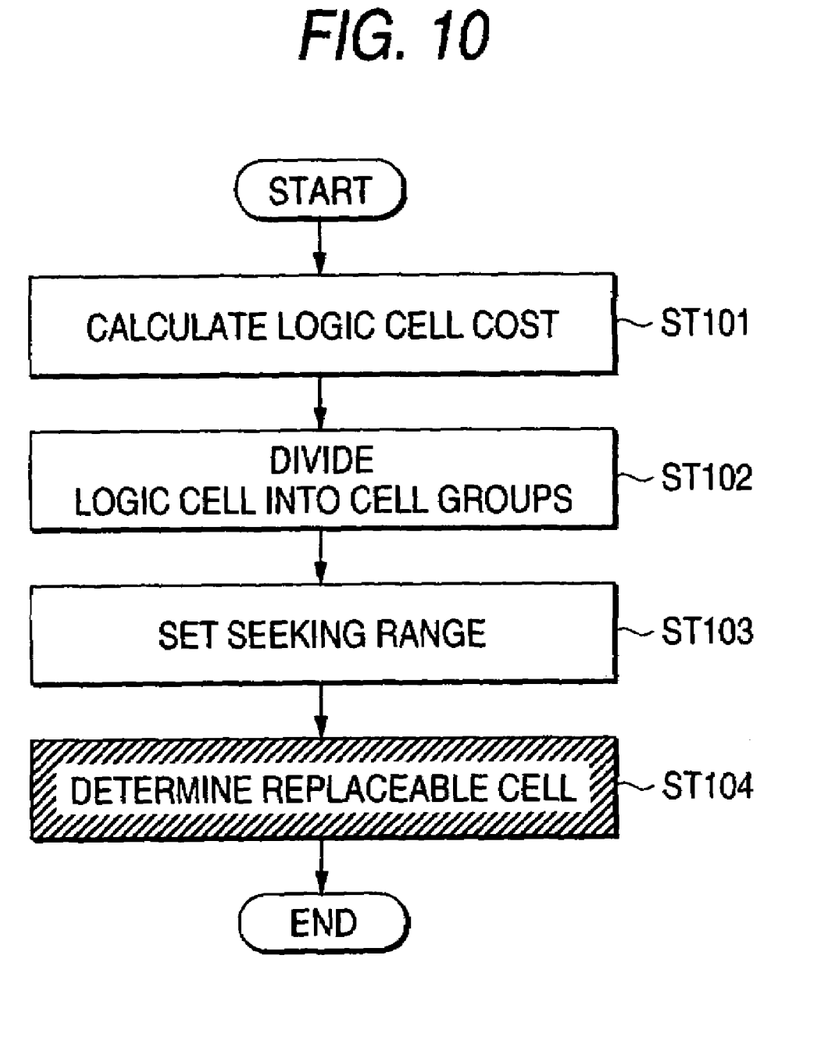
FIG. 10 is a diagram for explaining an extracting process flow chart of a replaceable cell.

First, in a step ST101, a cost indicated in formula 1 is calculated with respect to each of the improved logic cells.

$$\text{COST} = \sum_{i=1}^{Pi} \frac{1}{Npi} \quad \text{[Formula 1]}$$

Symbol "Pi" of the formula 1 indicates a total pin number of the logic cell Ci, and symbol "Npi" denotes a total cell number connected to a wiring line Ni.

Figure 11:
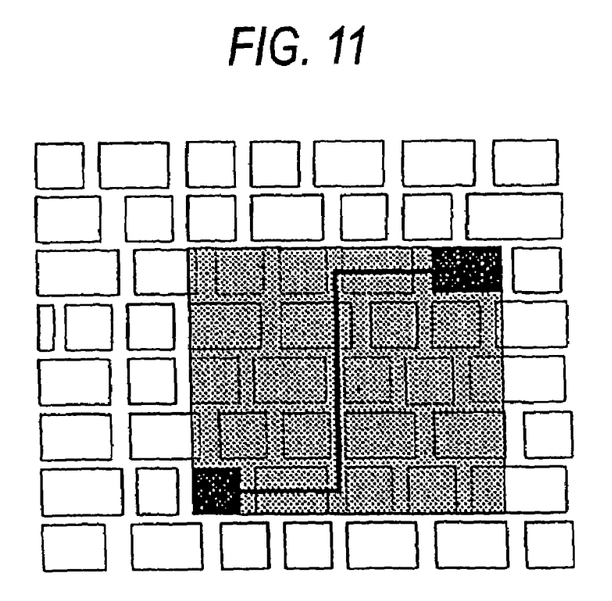
FIG. 11 is a diagram for indicating a cost calculating formula.
Figure 12:
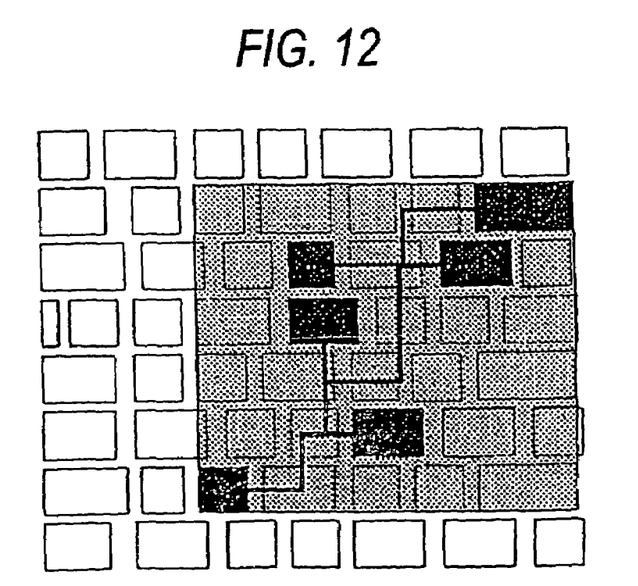
FIG. 12 is a diagram for representing a logic cell which determines a rectangular region for surrounding a wiring line.

In accordance with the cost calculation formula, such a logic cell which is connected to a large number of wiring lines owns a higher cost value. In other words, the larger a total number of wiring lines is increased which is adversely influenced in the case that a position of a logic cell is changed, the higher the cost value thereof is increased. Also, when an attention is paid to one wiring line, a cost value as to such a wiring line which is connected to a plurality of logic cells is low. This reason is given as follows: That is, as to such a wiring line which is connected to a larger number of logic cells, an important degree of one logic cell position becomes lower when a length of the wiring line is determined. For instance, until connection cells become 2, even if any one of these cells is moved, then a wiring line length is varied (see FIG. 11). However, when a total number of connection cells becomes larger than, 2, such a case that lengths of wiring lines are not gradually varied may occur (see FIG. 12). In FIG. 12, since there are only two logic cells which have determined rectangular regions which surround wiring lines, even when a position of another logic cell is changed, there is a possibility that the rectangular region for surrounding the wiring lines is not changed. As previously explained, generally speaking, the larger a total number of the logic cells connected to the wiring line is increased, the lower variation probability of the wiring line length is decreased which is caused by the positional movement of one logic cell.

As previously explained, in the formula 1, the cost calculation is carried out in such a manner that such a logic cell having large wiring line length influence probability caused by positional changes may have a large cost value.

Next, in a step ST102, logic cells are divided by "N" in the order of cost values so as to divide these logic cells into N sorts of groups. Symbol "N" indicates an arbitrary integer, which is determined based upon a used process and a circuit feature. In this case, for the sake of simple explanations, the arbitrary integer N is selected to be 2 in the following description.

Next, in a step ST103, a replaceable cell seeking range of a group having a small cost value is set as "L", whereas a replaceable cell seeking range of a group having a large cost value is set as "α×L." Symbol "α" indicates an arbitrary real number larger than, or equal to 0, and similar than, or equal to 1. This arbitrary real number "α" is determined based upon a used process and a circuit feature. In this case, for the sake of simple explanations, the arbitrary real number "α" is selected to be 0.5 in the following description.

Next, such logic cells which are mutually contained in the replaceable cell seeking range in the step ST103 are set as replaceable cells in a step ST104. In this example, since there are two sorts of replaceable cell seeking ranges, namely, "L" and "0.5L", maximum move ranges are different from each other every cell. That is, there are 3 sorts of maximum move ranges, namely, "2L" (in case that replaceable cell seeking ranges are equal to "L" with each other), "1.5L" (in case that replaceable cell seeking ranges are 1L and 0.5L), and "L" (in case that replaceable cell seeking ranges are equal to "0.5L" with each other).

Next, in a step ST22, the evaluation formula employed in the step ST12 is minimized based upon the replaceable cell information by way of an optimizing manner such as a simulated annealing manner.

Finally, wiring lines among the logic cells are formed in a step ST16 in a similar manner to that of the first embodiment mode.

As previously described, since the replaceable cells are determined by employing the cost calculation formula of the formula 1, the position moving range of the cell which is largely influenced by the variation of the wiring lines is suppressed, and thus, the logic cell placement can be improved. As a result, the entire wiring line variation is suppressed, so that a circuit having a timing margin can be realized.

In this second embodiment mode, the description has been made as to such a case that the two logical cells are replaced with each other. Alternatively since the replaceable cell seeking range is directly set as the movable range, the present invention may be readily applied also to such a case that one logic cell is moved as explained in the first embodiment mode.

Modification of Second Embodiment Mode

A modification 1 of the second embodiment mode owns a different point, as compared with the second embodiment mode. That is, in the second embodiment mode, the logic cells are subdivided into the cell groups based upon the cost value which has been calculated every logic cell in the step ST21, and the replaceable cell seeking range is determined every cell group. In the modification 1 of the second embodiment mode, replacement subject selecting probability is determined every group.

In the step ST22 in the second embodiment mode, since all of the logic cells own the same values (P=1/total cell number) as to the selecting probability (P) of the replacement subject cells, the logic cell is selected in an unintentional manner, so that the logic cell placement may be improved.

In the modification 1 of the second embodiment mode, the logic cell selecting probability is changed every group which has been determined in the step ST10 in the second embodiment mode (namely, selecting probability of group having large cost value is made lower than selecting probability of group having small cost value).

For example, changing of the logic cell selecting probability is realized by that the selecting probability as to the group having the small cost value is kept "P", and the selecting probability as to the group having the large cost value is selected to be "0.5P."

As previously explained, since the selecting probability of the position changing cell is determined by employing the cost value of the formula 1, the logic cell placement may be improved by employing the logic cell which is slightly influenced by the variation of the wiring line in a top priority. As a consequence, while the entire wiring line variation is suppressed, such a circuit having a timing margin can be realized.

In this modification 1 of the second embodiment mode, the description has been made as to such a case that the two logical cells are replaced with each other. Alternatively, the present invention may be readily applied also to such a case that one logic cell is moved.

Modification 2 of Second Embodiment

A modification 2 of the second embodiment mode owns a different point, as compared with the second embodiment mode. That is, in the second embodiment mode, the logic cells are subdivided into the cell groups based upon the cost value which has been calculated every logic cell in the step ST21, and the replaceable cell seeking range is determined every cell group. In the modification 2 of the second embodiment mode, a replaceable cell seeking range which is specified to a logic cell is determined based upon a margin value of each of wiring lines. In the second embodiment mode, the replaceable cell seeking range does not exceed 1L, whereas in the modification 2 of the second embodiment mode, there are some cases that a replaceable cell seeking range exceeds 1L.

Formula 2 indicates a calculation formula of a replaceable cell seeking range "Ri" of a logic cell "Ci."

$$Ri=\{MIN(\Delta Li: i \in Ci)\}/4 \qquad \text{[Formula 2]}$$

Symbol "$\Delta Li$" indicates a margin value of each of wiring lines which can be calculated from the circuit improvement result of the step ST13, and symbol "MIN" shows a minimum value within the margin value "$\Delta Li$."

In the step ST13, since a margin of 4L has been set with respect to each of the wiring lines, each of the wiring lines own the margin value of 4L at its minimum. There are some possibilities that a certain wiring line owns a constant (for example, Ls) margin before a circuit is improved. In this case, since a margin of 4L is set in the step ST13, a resulting margin value becomes "Ls+4L", so that the replaceable cell seeking range Ri becomes (Ls+4L)/4.

As previously described, in such a case that the smallest margin of the wiring line connected to the logic cell is larger than 4L based upon the formula 2, since the replaceable cell seeking range of this logic cell is widened, the seeking space in the optimizing operation of the step ST22 is widened, so that the more optimal logic cell placement may be realized.

It should also be understood that in this modification 2 of the second embodiment mode, the description has been made as to such a case that the two logical cells are replaced with each other. Alternatively, since the replaceable cell seeking range is directly set as the movable range, the present invention may be readily applied also to such a case that one logic cell is moved as explained in the first embodiment mode.

Third Embodiment Mode

A layout method according to a third embodiment mode of the present invention will now be explained with employment of a flow chart shown in FIG. 13.

Figure 13:
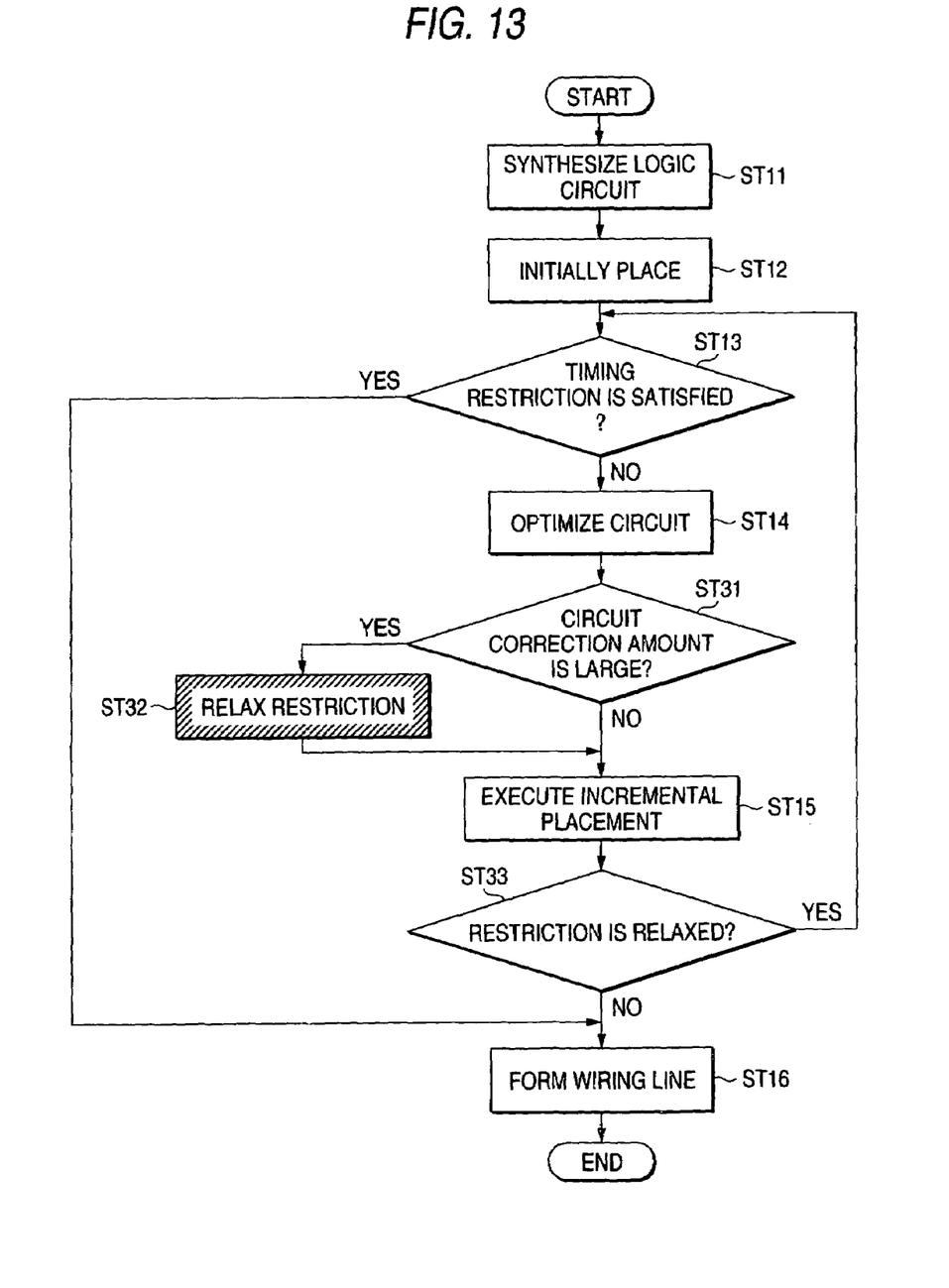
FIG. 13 is a diagram for showing a process flow chart according to a third embodiment mode of the present invention.

Steps of ST11, ST12, S13, ST14, ST15, and ST16 in FIG. 13 correspond to same steps defined in the first embodiment mode.

The layout method is firstly performed in same process operations to those of the first embodiment mode up to the step ST 14.

In a next step ST31, a circuit change amount of the logic circuit which has been corrected in the step ST14 is calculated. In the case that the circuit change amount exceeds a constant value, the layout method is advanced to a step ST32 in which the replaceable cell seeking range 1L is substituted by "1L+$\Delta$L." In such a case that the circuit change amount does not exceed the constant value, the layout method is advanced to the step ST15. In this case, symbol "$\Delta L$" indicates a positive value.

As the circuit change amount, this circuit change amount may be readily expressed by employing a summation of absolute values as to increased/decreased areas of logic cells.

In the next step ST15, a placement improving process operation of logic cells similar to that of the embodiment mode 1 is carried out.

Since the replaceable cell seeking range 1L has been substituted by "1L+ΔL" in the step ST32, there are some cases that a variation of such a wiring line length will occur which exceeds the margin 4L considered in the step ST14. As a consequence, a judgment is made as to whether or not the replaceable cell seeking range 1L has been substituted by "1L +ΔL" in a step ST33. When the replaceable cell seeking range 1L has been substituted by "1L +ΔL", the process operation is again carried out from the step ST13. When the replaceable cell seeking range 1L has not yet been substituted by "1L+ΔL", wiring lines among the logic cells are formed in the step ST16.

In the case that a correction amount of a logic circuit is large, a disturbance from the initial placement which has been performed in the step ST12 becomes large. More specifically, in such a case that an optimum characteristic of wiring density is considerably lowered, even when a timing error temporarily occurs, if the logic cell placement is not improved, then forming of the wiring lines among the logic cells in the step ST16 is not completed.

As previously explained, in accordance with the third embodiment mode, since the correction amount of the logic circuit is large, in such a case that the initial logic cell placement is largely changed, even when the timing error is temporarily produced, the placement of the logic cells is improved. As a result, the layout can be accomplished by firmly completing the layout method up to the wiring step.

Modification of Third Embodiment Mode

A modification of the third embodiment mode owns a different point from that of the third embodiment mode. In the third embodiment mode, the step ST32 for relaxing the restriction 1L is executed based upon the circuit correction amount corrected in the step ST14. In the modification of the third embodiment mode, in such a case that the placement of the logic cell in the step ST15 is not sufficiently improved (evaluation value is not optimized), such a step ST32 for relaxing the replaceable cell seeking range 1L is carried out.

A layout method according to the modification of the third embodiment mode of the present invention will now be explained with employment of a flow chart shown in FIG. 14.

Figure 14:
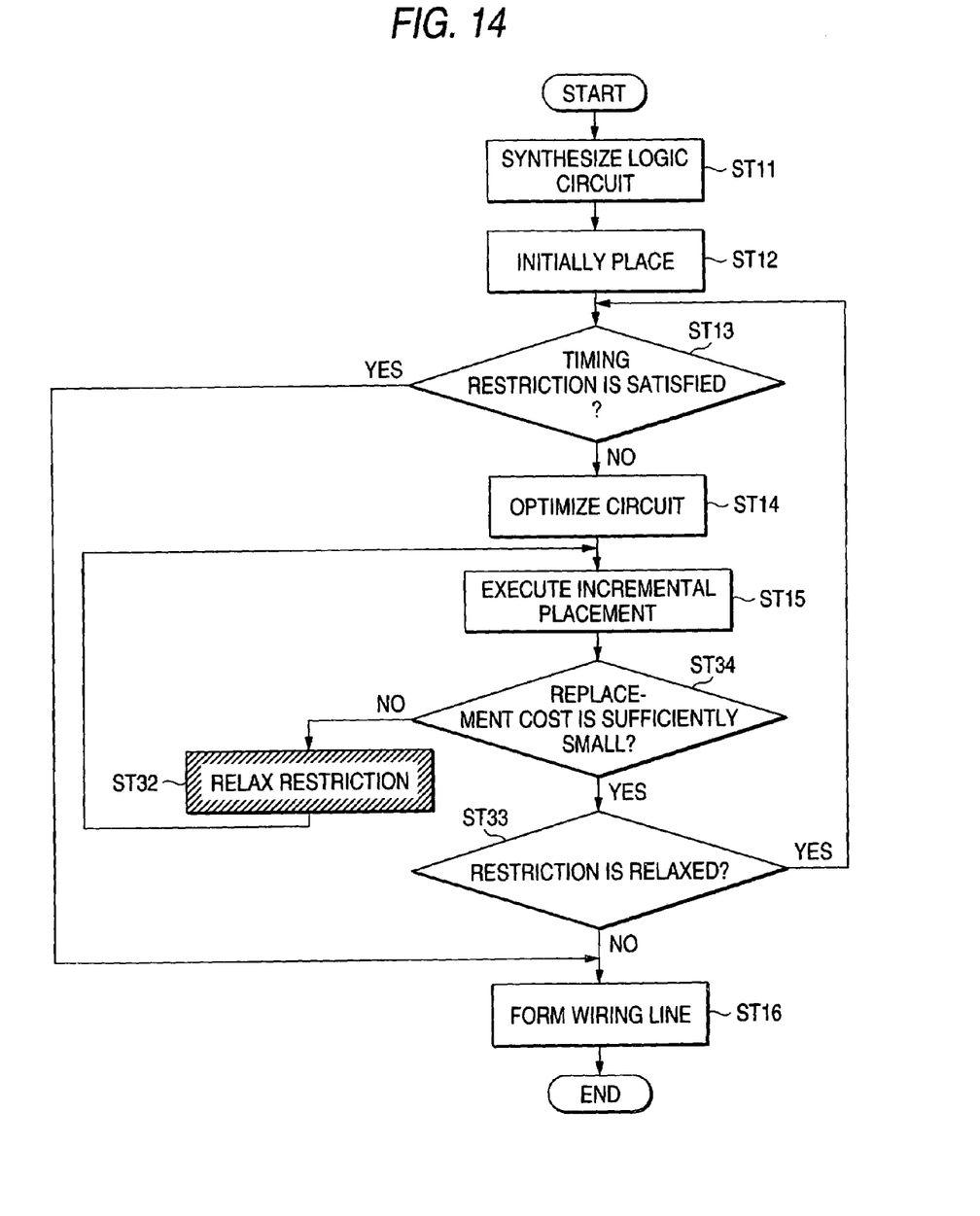
FIG. 14 is a diagram for indicating a process flow operation according to a modification of the third embodiment mode of the present invention.

Steps of ST11, ST12, ST13, ST14, ST15, and ST16 in FIG. 14 correspond to same steps defined in the first embodiment mode. Steps ST31, ST32, and ST33 in FIG. 14 correspond to same steps defined in the third embodiment mode.

The layout method is firstly performed in same process operations to those of the first embodiment mode up to the step ST14.

In a next step ST34, a placement evaluation value corresponding to the final result of the step ST15 is evaluated. If the placement evaluation value is sufficiently small, then the process operation of the layout method is advanced to a step ST33. If the placement evaluation value is not sufficiently small, then the process operation is advanced to a step ST32.

In the case that the process operation is advanced to the step ST32, the replaceable cell seeking range 1L is substituted by "1L+ΔL" in a similar manner to that of the third embodiment mode, and the process operation is retried from the step ST13.

In the case that the process operation is advanced to the step ST33, a judgement is made as to whether or not the replaceable cell seeking range 1L has been substituted in a similar manner to that of the third embodiment mode. In such a case that the replaceable cell seeking range 1L has been substituted, the process operation is retried from the step ST13. To the contrary, in such a case that the replaceable cell seeking range 1L has not yet been substituted, a wiring line is formed between standard cells in the step ST16.

In the case that the optimizing characteristic of the placement is low in the placement improving step ST14, more specifically, in such a case that an optimum characteristic of wiring density is considerably lowered, even when a timing error temporarily occurs, if the logic cell placement is not improved, then forming of the wiring lines among the standard cells in the step ST16 are not completed.

As previously explained, in accordance with the modification of the third embodiment mode, in such a case that a sufficient placement improvement is not carried out, even when the timing error is temporarily produced, the placement of the logic cells is improved. As a result, the layout can be accomplished by firmly completing the layout method up to the wiring step.

The layout designing method for the semiconductor integrated circuit, according to the present invention, is provided with the placement change restriction calculating step for calculating the layout placement change restriction, and thus, is useful as the layout designing method capable of converging the layout corrections in the earlier stage.

What is claimed is:

1. In an automatic layout method of a logic circuit, an automatic layout method of a semiconductor integrated circuit, comprising:
    a defining step of defining a relationship between a margin of a constant length to a wiring line length "L" and a placement change restriction;
    an initial arranging step of initially arranging a logic cell which constitutes the logic circuit;
    a placement base circuit optimizing step of applying the margin of a constant length to the wiring line length L obtained from a placement so as to improve timing;
    a placement change restriction calculating step of calculating a placement change restriction corresponding to the margin of the constant length;
    an incremental arranging step of carrying out a placement improvement having the placement change restriction calculated based upon the placement change restriction calculating step in case that a logic cell placement of a corrected logic circuit is improved; and
    a layout data outputting step of outputting layout data based on the arranged placement information.

2. The automatic layout method of the semiconductor integrated circuit according to claim 1 wherein:
    in case that the margin of the constant length is set to "4L" in the placement base circuit optimizing step, the placement change restriction is defined as a movable distance having a Manhattan distance "2L" from the arranging position determined in the initial arranging step; and
    in the incremental arranging step, the placement improvement is carried out by sequentially moving the logic cell within a range of the movable distance.

3. The automatic layout method of the semiconductor integrated circuit according to claim 2 wherein:
the placement change restriction calculating step is comprised of:
a logic cell cost calculating step of calculating a cost corresponding to a wiring line connected to the logic cell every logic cell;
a logic cell group dividing step of dividing the logic cell into a plurality of groups in response to the cost value; and
a movable distance re-setting step of again setting the movable distance set in the incremental arranging step in such a manner that while a movable distance of a logic cell group having the largest cost value is set as 2L, when the cost value of the logic cell group becomes smaller, the movable distance thereof is made shorter than 2L.

4. The automatic layout method of the semiconductor integrated circuit according to claim 1 wherein:
in case that the margin of the constant length is set to "4L" in the placement base circuit optimizing step, the placement change restriction is set to a replaceable cell seeking distance having a Manhattan distance "1L" the placement change restriction calculating step; and
in the incremental arranging step, the placement improvement is carried out by sequentially replacing cells with each other within the replaceable cell seeking distance from the arranging position determined in the initial arranging step.

5. The automatic layout method of the semiconductor integrated circuit according to claim 4 wherein:
the placement change restriction calculating step is comprised of:
a logic cell cost calculating step of calculating a cost corresponding to a wiring line connected to the logic cell every logic cell;
a logic cell group dividing step of dividing the logic cell into a plurality of groups in response to the cost value; and
a replaceable seeking distance re-setting step of again setting the replaceable seeking distance set in the incremental arranging step in such a manner that while a replaceable seeking distance of a logic cell group having the largest cost value is set as 1L, when the cost value of the logic cell group becomes smaller, the replaceable seeking distance thereof is made shorter than 1L.

6. The automatic layout method of the semiconductor integrated circuit according to claim 1 wherein:
in case that the margin of the constant length is set to "4L" in the placement base circuit optimizing step, the placement change restriction is set to both a movable distance and a replaceable cell seeking distance each have a value "1L" in the placement change restriction calculating step; and
in the incremental arranging step, the placement improvement is carried out by sequentially performing both an operation for replacing cells with each other within the replaceable cell seeking distance from the arranging position determined in the initial arranging step, and another operation for moving the logic cell within a range of the movable distance from the arranging position determined in the initial arranging step.

7. The automatic layout method of the semiconductor integrated circuit according to claim 6 wherein:
the placement change restriction calculating step is comprised of:
a logic cell cost calculating step of calculating a cost corresponding to a wiring line connected to the logic cell every logic cell;
a logic cell group dividing step of dividing the logic cell into a plurality of groups in response to the cost value; and
a seeking move distance re-setting step of again setting the movable distance and the replaceable seeking distance set in the incremental arranging step in such a manner that while a movable distance and a replaceable seeking distance of a logic cell group having the largest cost value is set as 1L, when the cost value of the logic cell group becomes smaller, the movable distance and the replaceable seeking distance thereof are made shorter than 1L.

8. The automatic layout method of the semiconductor integrated circuit according to any one of claims 2, 4 and 6, wherein:
subsequent to the placement change restriction calculating step, the automatic layout method is further comprised of:
a logic cell cost calculating step of calculating a cost corresponding to a wiring line connected to the logic cell;
a logic cell group dividing group of dividing the logic cell into a plurality of groups in response to the cost values; and
an improvement subject probability setting step in which when the cost value of the logic cell group becomes smaller, probability at which the logic cell becomes a placement improvement subject cell in the incremental arranging step is set to be small.

9. The automatic layout method of the semiconductor integrated circuit according to any one of claims 3, 5 and 7, wherein:
in the logic cell cost calculating step, such a value which is in inverse proportion to a total pin number of a logic cell connected to a wiring line is assumed as a cost value of the wiring line, whereas a summation of costs of wiring lines connected to a logic cell is assumed as a cost value of the logic cell.

10. The automatic layout method of the semiconductor integrated circuit according to claim 1 wherein:
the placement change restriction calculating step is further comprised of:
a timing margin value calculating step of calculating a timing margin value of each of the wiring lines by way of a timing analysis;
a wiring line length margin value calculating step of calculating a wiring line length margin value from the timing margin value; and
a margin placement change restriction calculating step of calculating the placement change restriction used in the incremental arranging step from the wiring line length margin value calculation owned by each of the wiring lines.

11. In an automatic layout method of a logic circuit,
an automatic layout method of a semiconductor integrated circuit, comprising:
an initial arranging step of initially arranging a logic cell which constitutes the logic circuit;
a placement base circuit optimizing step of applying a margin of a constant length to a wiring line length obtained from a placement so as to improve timing;
a placement change restriction relaxing step in which in such a case that a circuit amount changed in the placement base circuit optimizing step exceeds a constant value, the placement change restriction based upon the margin of the constant length is relaxed;

an incremental arranging step in which when a logic cell placement of a corrected logic circuit is improved, a placement improvement based upon the placement change restriction calculating step is carried out;

an ending condition judging step in which in such a case that the placement improvement with employment of the relaxed placement change restriction has been carried out, the automatic layout method is returned to the placement base circuit optimizing step, and a layout data outputting step of outputting a layout data based on the arranged placement information.

12. In an automatic layout method of a logic circuit, an automatic layout method of a semiconductor integrated circuit, comprising:

an initial arranging step of initially arranging a logic cell which constitutes the logic circuit;

a placement base circuit optimizing step of applying a margin of a constant length to a wiring line length obtained from a placement so as to improve timing;

a placement change restriction calculating step of calculating a placement change restriction corresponding to the margin of the constant length;

an incremental arranging step in which when a logic cell placement of a corrected logic circuit is improved, an placement improvement based upon the placement change restriction calculating step is carried out;

a placement quality judging step in which in such a case that an placement quality realized in the incremental arranging step is judged and the judged placement quality is lower than, or equal to a constant reference, the placement change restriction is relaxed and the automatic layout method is returned to the incremental arranging step, whereas in such a case that a placement quality realized in the incremental arranging step is judged and the judged placement quality is not lower than, or equal to the constant reference, the automatic layout method is advanced to a condition judging step;

an ending condition judging step in which in such a case that the placement improvement with employment of the relaxed placement change restriction has been carried out, the automatic layout method is returned to the placement base circuit optimizing step; and a layout data outputting step of outputting layout data based on the arranged placement information.

* * * * *